United States Patent
Fukumoto et al.

[11] Patent Number: 5,914,515
[45] Date of Patent: Jun. 22, 1999

[54] SEMICONDUCTOR DEVICE

[75] Inventors: Harutsugu Fukumoto, Anjo; Hiroaki Tanaka, Okazaki; Kazuhiro Tsuruta, Toyoake, all of Japan

[73] Assignee: Nippondenso Co., Ltd, Kariya, Japan

[21] Appl. No.: 08/499,472

[22] Filed: Jul. 7, 1995

[30] Foreign Application Priority Data

Jul. 8, 1994 [JP] Japan .................................. 6-157614

[51] Int. Cl.⁶ .................................................. H01L 27/01
[52] U.S. Cl. .......................... 257/351; 257/374; 257/508
[58] Field of Search ................................ 257/351, 350, 257/374, 508

[56] References Cited

U.S. PATENT DOCUMENTS

| | | | |
|---|---|---|---|
| 3,356,858 | 12/1967 | Wanlass | 257/369 |
| 4,748,485 | 5/1988 | Vasudev | 257/351 |
| 5,004,936 | 4/1991 | Andresen | 326/27 |
| 5,306,942 | 4/1994 | Fujii | 257/508 |
| 5,602,551 | 2/1997 | Fukumoto et al. | 341/136 |
| 5,610,533 | 3/1997 | Arimoto et al. | 326/33 |

FOREIGN PATENT DOCUMENTS

| | | |
|---|---|---|
| 2294076 | 12/1990 | Japan . |
| 3-82151 | 4/1991 | Japan . |
| 4125960 | 4/1992 | Japan . |
| 5108194 | 4/1993 | Japan . |
| 6-21443 | 1/1994 | Japan . |

OTHER PUBLICATIONS

K. Tsuruta et al., disclosure of US Serial Number 08/309,333 filed Sep. 20, 1994, abandoned.

Primary Examiner—J. Carroll
Attorney, Agent, or Firm—Pillsbury Madison & Sutro LLP

[57] ABSTRACT

A semiconductor device, which can realize a high speed operation of a transistor with a small leakage current whenever such operation is required, is disclosed. A SOI layer is formed on a monocrystalline silicon substrate through a silicon oxide film, and C-MOS circuits (inverter circuits) are configured with P-channel type MOSFETs and N-channel type MOSFETs on the layer. A bias electrode for P-channel is disposed within the silicon oxide film facing the P-channel type MOSFETs, while a bias electrode for N-channel is disposed within the silicon oxide film facing the N-channel type MOSFETs. A bias voltage switching circuit applies electric potentials to the bias electrodes for the P-channel and the N-channel to increase the respective absolute values of threshold voltages of the P-channel type and N-channel type MOSFETs when the MOSFETs are in a waiting state and applies the electric potentials to the bias electrodes for the P-channel and the N-channel to reduce the respective absolute values of threshold voltages of the P-channel type and N-channel type MOSFETs when the MOSFETs are in an operating state.

8 Claims, 5 Drawing Sheets

SEMICONDUCTOR DEVICE

CROSS REFERENCE TO RELATED APPLICATION

This application is based upon and claims the benefit of priority of the prior Japanese Patent application No. 6-157614 filed on Jul. 8, 1994, the contents of which are incorporated herein by reference.

BACKGROUND OF THE INVENTION

1. Field of the Invention

The present invention generally relates to semiconductor devices. More particularly, the present invention relates to a semiconductor device which has employed an SOI structure, and is an effective technique for DSP, CPU and other semiconductor devices for use in portable equipment operable at a low voltage.

2. Related Arts

As disclosed in the Japanese Unexamined Publication Nos. 3-82151, 4-125960, 5-108194 or 6-21443, a technique which enables a semiconductor device to operate at a high speed by reducing a threshold voltage when the semiconductor device is in an operating state and to reduce a power consumption by increasing the threshold voltage when the semiconductor device is in a waiting (standby) state has been publicized. However, each of the semiconductor devices disclosed in these publications includes an external source circuit called a "charge pump" and controls the threshold voltage by applying a source voltage to a substrate or a well layer.

In a MOS transistor having a bulk structure, the substrate or well layer and source and drain regions disposed therein are separated from each other by a PN isolation region. In order to prevent an electric current from flowing when the PN isolation region takes the forward-bias direction, it is necessary to apply an electric potential higher than that of a ground potential or a source voltage on which the MOS transistor is operating to the substrate. To accomplish this purpose, a special circuit (external source circuit) is essential to the conventional technique.

However, the external source circuit poses problems because it not only requires an additional circuit area but also consumes additional electric power.

SUMMARY OF THE INVENTION

In view of the problems discussed above, the present invention has an object to provide a semiconductor device which can reduce a threshold voltage to operate at a high speed in an operating state and increase the threshold voltage to reduce an electric power consumption in a waiting state without additionally using any external source circuit such as charge pump.

In order to achieve the above object, the present invention involves paid the use of the respective electric potentials of the ground potential and source voltage for controlling the threshold voltage while realizing electric isolation between source and drain regions and a buried electrode for controlling the threshold value by combining an SOI structure with an electric potential switching means.

Specifically, according to the present invention, a semiconductor device is provided which includes an MOSFET formed in a monocrystalline semiconductor layer on a substrate with an insulator layer interposed therebetween. The semiconductor device comprises an electrode disposed within the insulator layer facing at least the channel region of the MOSFET. A bias voltage switching means applies a first potential to the electrode to increase the absolute value of threshold voltage of the MOSFET when the MOSFET is in a waiting state and applies a second potential to reduce the absolute value of threshold voltage of the MOSFET when the MOSFET is in an operating state.

On the other hand, the present invention can be applied to a semiconductor device which includes a plurality of monocrystalline semiconductor layers formed on a substrate with an insulator layer interposed therebetween and a C-MOS circuit configured with a P-channel type MOSFET and an N-channel type MOSFET within the respective monocrystalline layers. When the present invention is used in this manner, it is advisable that such a semiconductor device comprise a first electrode within the insulator layer facing at least the channel region of the P-channel type MOSFET, a second electrode within the insulator layer facing at least the channel region of the N-channel type MOSFET, and a bias voltage switching means for applying an electric potential to the first and second electrodes. The electric potential is applied to the first and second electrodes to increase the respective absolute voltages of threshold voltages of the MOSFETs when the MOSFETs are in a waiting state and to reduce the respective absolute values of threshold voltages of the MOSFETs when the MOSFETs are in the operating state.

Here, it is also advisable to configure the above bias voltage switching means with an inverter circuit.

According to the present invention, the electrode is disposed within the insulator layer facing at least the channel region of the MOSFET. The bias voltage switching means applies the electric potential to the electrode to increase the absolute value of threshold voltage of the MOSFET when the MOSFET is in the waiting state and applies the electric potential to the electrode to reduce the absolute value of threshold voltage of the MOSFET when the MOSFET is in the operating state. As a result, when the MOSFET is in the waiting state, although the absolute value of the threshold voltage is increased and therefore, the operation speed is slow, the leak current can be reduced. When the MOSFET is in the operating state, although the absolute value of the threshold voltage is reduced, and therefore, the leak current is large, the operation speed can be increased.

Here, by using inverter circuit as a bias voltage switching means, it is possible to selectively output two different electric potentials according to a control signal in a simple construction.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PRESENTLY PREFERRED EXEMPLARY EMBODIMENTS

A preferred embodiment of the present invention will now be described with reference to the appended drawings.

Figure 1:
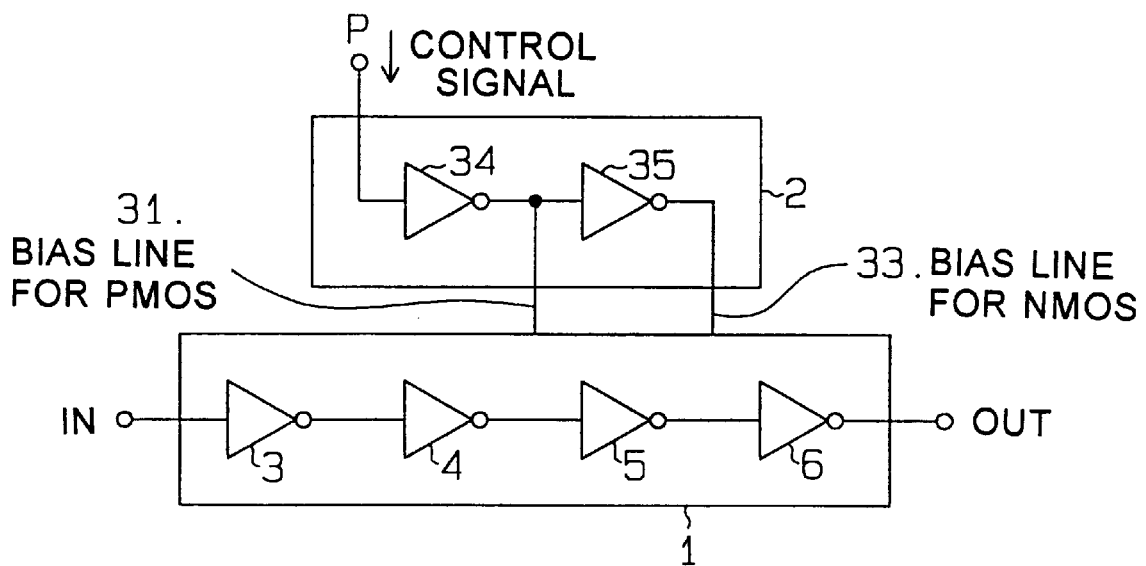
FIG. 1 is an electric circuit diagram showing an electric configuration of a semiconductor device according to an embodiment.

FIG. 1 is an electric configuration of a semiconductor device according to an embodiment of the present invention. This semiconductor device comprises an LSI 1 and a bias voltage switching circuit 2 as a bias voltage switching means. The LSI 1 comprises four inverter circuits 3, 4, 5 and 6 which are connected in series.

Figure 2:
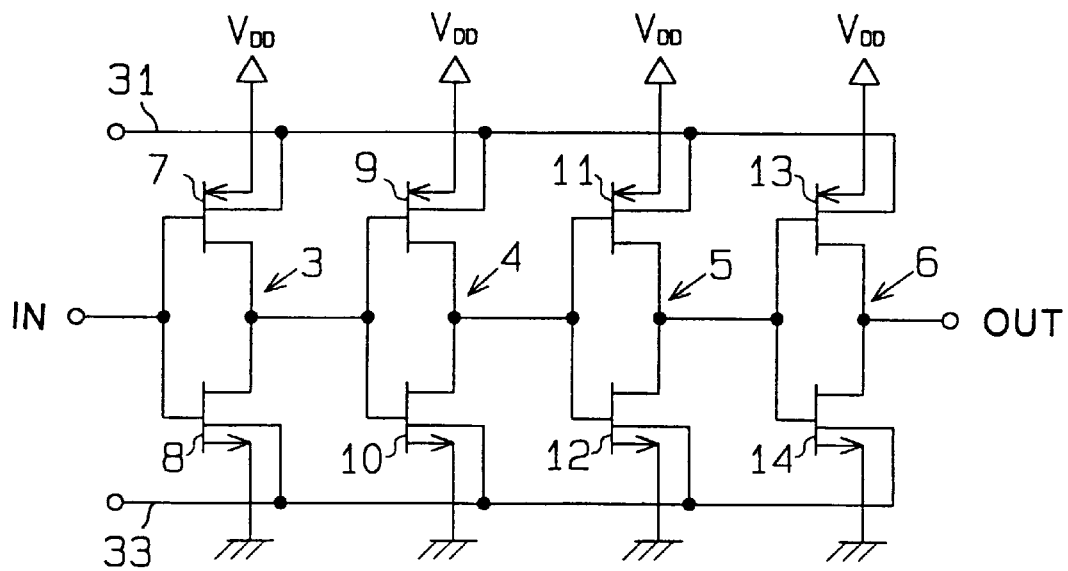
FIG. 2 is an electric circuit diagram showing an electric configuration of an LSI.

The respective inverter circuits 3–6 of the LSI 1 are configured with C-MOS circuits as shown in FIG. 2. Specifically, the inverter circuit 3 comprises a P-channel type MOSFET 7 and an N-channel type MOSFET 8. The inverter circuit 4 comprises a P-channel type MOSFET 9 and an N-channel type MOSFET 10. The inverter circuit 5 comprises a P-channel type MOSFET 11 and an N-channel type MOSFET 12. The inverter circuit 6 comprises a P-channel type MOSFET 13 and an N-channel type MOSFET 14.

To respective source terminals of the P-channel type MOSFETs 7, 9, 11 and 13 of the inverter circuits 3–6. On the other hand, a ground potential (0 volts) is applied to respective source terminals of the N-channel type MOSFETs 8, 10, 12 and 14 of the inverter circuits 3–6 (0 volt). Furthermore, an input signal is inputted into a gate terminal of the P-channel type MOSFET 7 and N-channel type MOSFET 8 of the inverter circuit 3. On the other hand, a drain terminal of the P-channel type MOSFET 13 and N-channel type MOSFET 14 of the inverter circuit 6 outputs an output signal.

Figure 3:
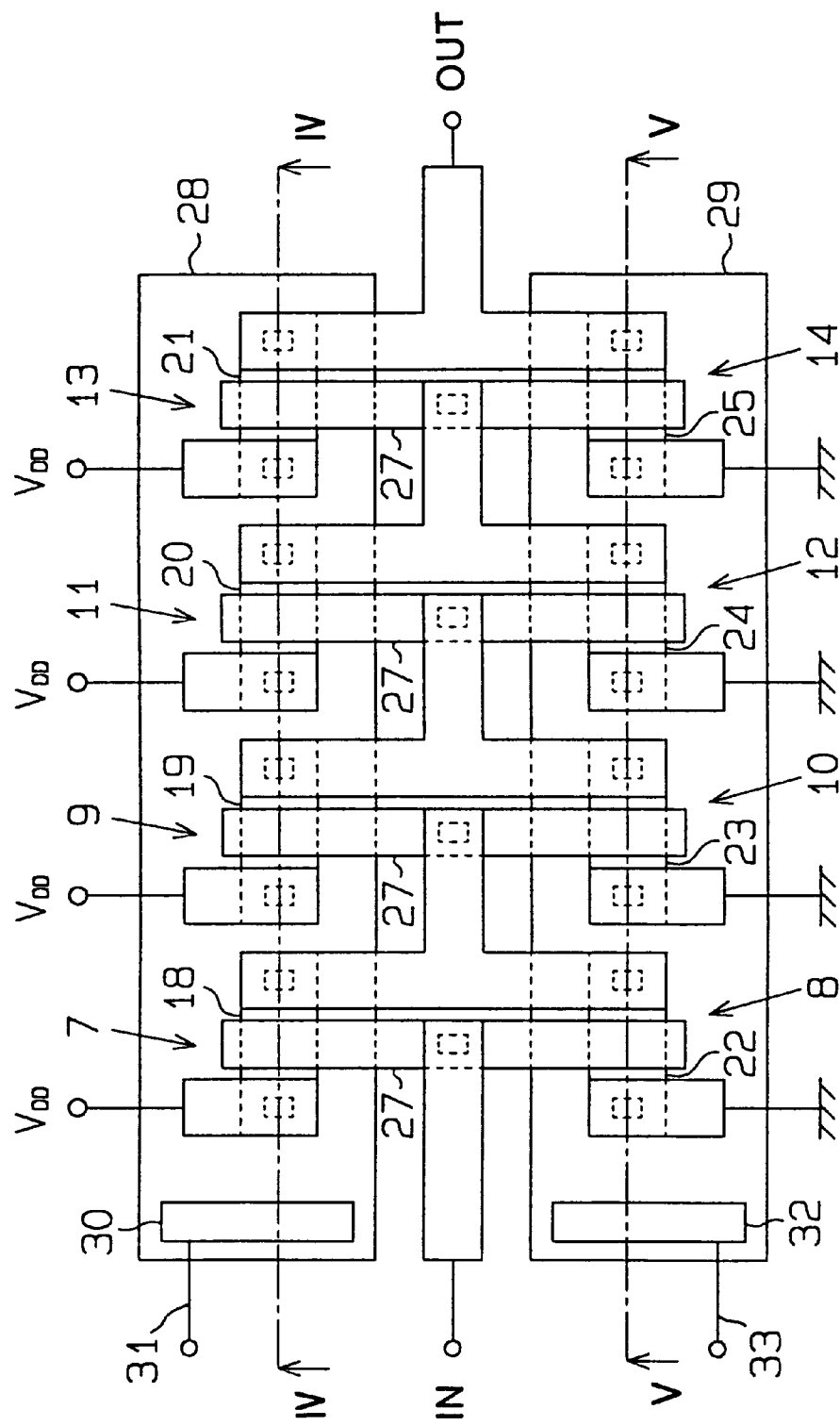
FIG. 3 is a plan view showing the semiconductor device according to the embodiment.
Figure 4:
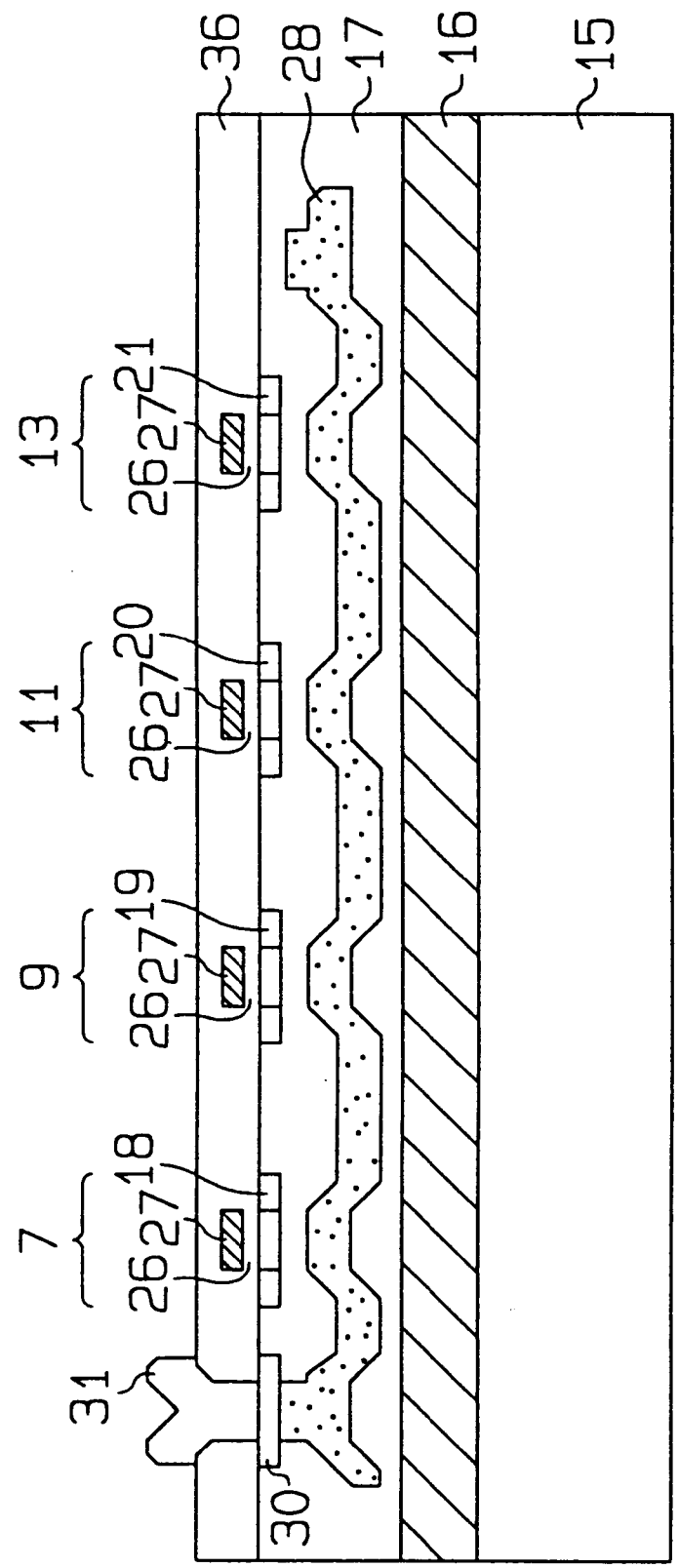
FIG. 4 is a cross-sectional view taken along the line IV—IV in FIG. 3.
Figure 5:
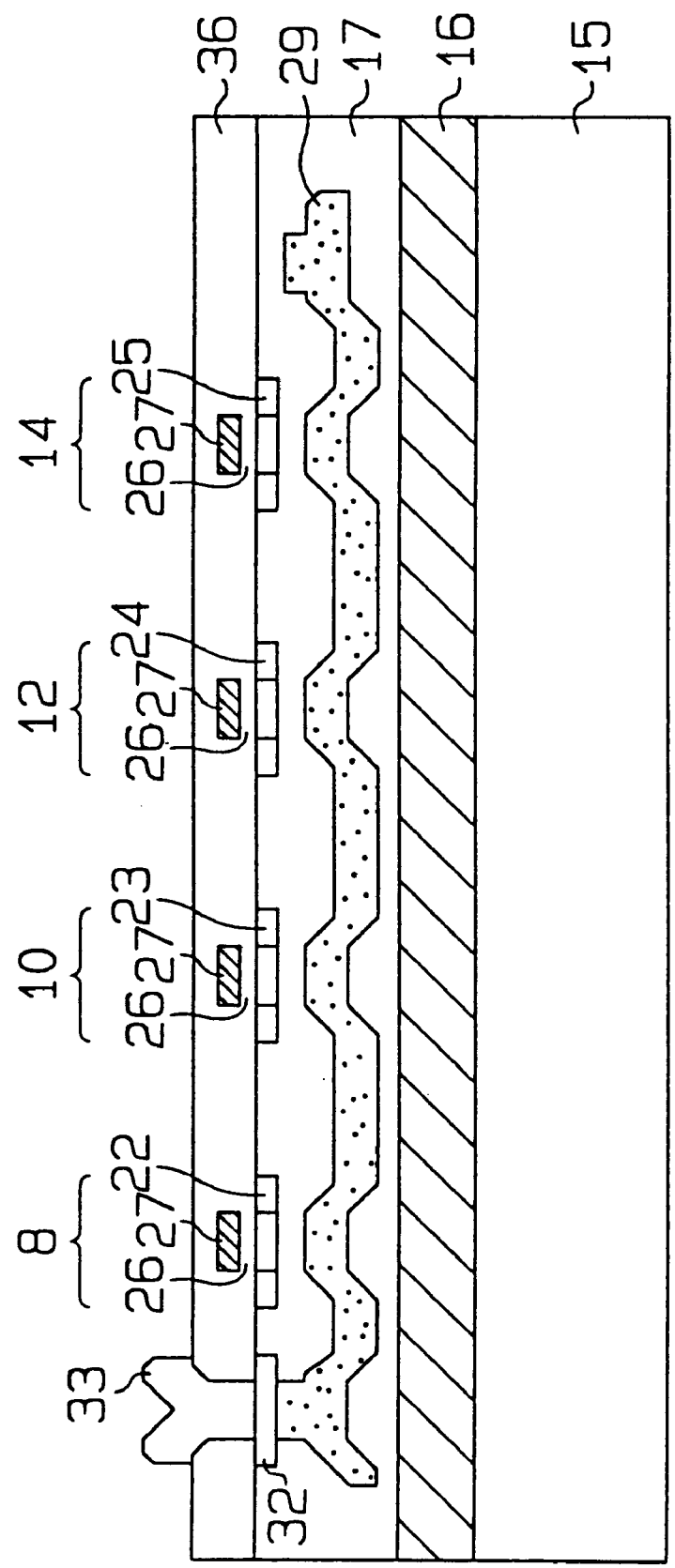
FIG. 5 is a cross-sectional view taken along the line V—V in FIG. 3.

FIG. 3 is a plan view of the semiconductor device according to the present embodiment, FIG. 4 is a cross-sectional view taken along the line IV—IV of FIG. 3, and FIG. 5 is a cross-sectional view taken along the line V—V in FIG. 3. In FIGS. 3–5 a silicon oxide film 17 is formed on a monocrystalline silicon substrate 15 as an insulator layer with a polycrystalline silicon film 16 interposed therebetween. This film monocrystalline silicon layers (hereinafter referred to as "thin film SOI layers") are formed on the silicon dioxide film surface 17 as monocrystalline semiconductor layers 18, 19, 20, 21, 22, 23, 24 and 25. Polycrystalline silicon gate electrodes 27 are formed on the respective thin film SOI layers 18–25 with gate oxide films 26 interposed therebetween. Accordingly, P-channel type MOSFETs 7, 9, 11 and 13 are respectively formed on the thin film SOI layers 18–21, while N-channel type MOSFETs 8, 10, 12 and 14 are respectively formed on the thin film SOI layers 22–25. In this way, P-channel type and N-channel type thin film SOI-MOSFETs are formed. It is noted that the MOSFETs are constructed so that the respective thicknesses of the SOI layers 18–25 are smaller than the respective maximum depletion layer widths of the channel regions so that the SOI layers 18–25 can completely and fully be depleted when the channels are formed.

A polycrystalline silicon bias electrode 28 for biasing the P-channel MOSFETs as a first electrode and a polycrystalline silicon bias electrode 29 for biasing the N-channel MOSFETs as a second electrode are laid within the silicon oxide film 17. The bias electrode 28 for the P-channel extends under all of the thin film SOI layers 18–21 composing P-channel MOSFETs. More specifically, as illustrated in FIG. 4, the bias electrode 28 for the P-channel is disposed so as to be closer under the respective channel regions of the P-channel MOSFETS. On the other hand, the bias electrode 29 for the N-channel extends under all of the thin film SOI layers 22–25 composing the N-channel MOSFETs. More specifically, as illustrated in FIG. 5, the bias electrode 29 for N-channel is disposed so as to be closer under the respective channel regions of the N-channel MOSFETS.

The bias electrode 28 for the P-channel is connected with a bias line 31 for the P-channel via a thin film monocrystalline silicon layer (thin film SOI layer) 30 formed on the surface of the silicon oxide film 17. In the same way, the bias electrode 29 for the N-channel is connected with a bias line 33 for the N-channel via a thin film monocrystalline silicon layer (thin film SOI layer) 32 formed on the surface of the silicon oxide film 17. These thin film SOI layers 30 and 32 are doped with impurities to a high concentration for providing ohmic contacts. On the other hand, the surface of the silicon oxide film 17 is covered with a BPSG film 36 as shown in FIG. 4 and FIG. 5.

As described above, the bias electrode 28 for the P-channel type MOSFETs and the bias electrode 29 for the N-channel type MOSFETs are separately provided so that the back gate bias voltage of each FET can be changed by the bias line 31 for the P-channel and the bias line 33 for the N-channel as shown in FIG. 2.

As illustrated in FIG. 1, the bias voltage switching circuit 2 comprises two inverter circuits 34 and 35 connected in series. The inverter circuits 34 and 35 are configured with C-MOS circuits, respectively. This bias voltage switching circuit 2 is also formed on a SOI layer disposed on the surface part of the above-described silicon oxide film 17 illustrated in FIG. 4 and FIG. 5. A control input signal terminal P is connected to an input terminal of the inverter circuit 34 of the bias voltage switching circuit 2. A bias line 31 for the P-channel is connected to an output terminal of the inverter circuit 34. The bias line 33 for the N-channel is connected to an output terminal of the inverter circuit 35. A control signal with logic Hi or Low level is inputted into the control signal terminal P. This control signal switches the respective electric potentials of the bias line 31 for the P-channel and bias line 33 for the N-channel to the source voltage $V_{DD}$ (3 volts) or to the ground potential (0 volt). Specifically, when the Low-level control signal is inputted into the control signal terminal P, the electric potential of the bias line 31 for the P-channel is switched to the source voltage $V_{DD}$ (3 volts) and the electric potential of the bias line 33 for the N-channel to the ground potential (0 volt). When the Hi-level signal is inputted into the control signal terminal P, the electric potential of the bias line 31 for the P-channel is switched to the ground potential (0 volt) and the electric potential of the bias line 33 for the N-channel to the source voltage $V_{DD}$ (3 volts).

Here, the relation among a threshold voltage $V_t$, a leakage current and an operation speed will be described.

The leakage current (subthreshold current) exhibits a characteristic that the larger the absolute value of the threshold voltage $V_t$ is, the smaller the leakage current is, and the smaller the absolute value of the threshold voltage $V_t$ is, the larger the leakage current is. On the other hand, the operation speed exhibits a characteristic that the larger the absolute value of the threshold voltage $V_t$ is, the slower the operation speed is, and the smaller the absolute value of the threshold voltage $V_t$ is, the faster the operational speed is.

Accordingly, the leakage current and the operation speed conflict with each other in normal cases.

Next, description will be given to describe the mode of operation of the semiconductor device which is constructed as described above.

Figure 6:
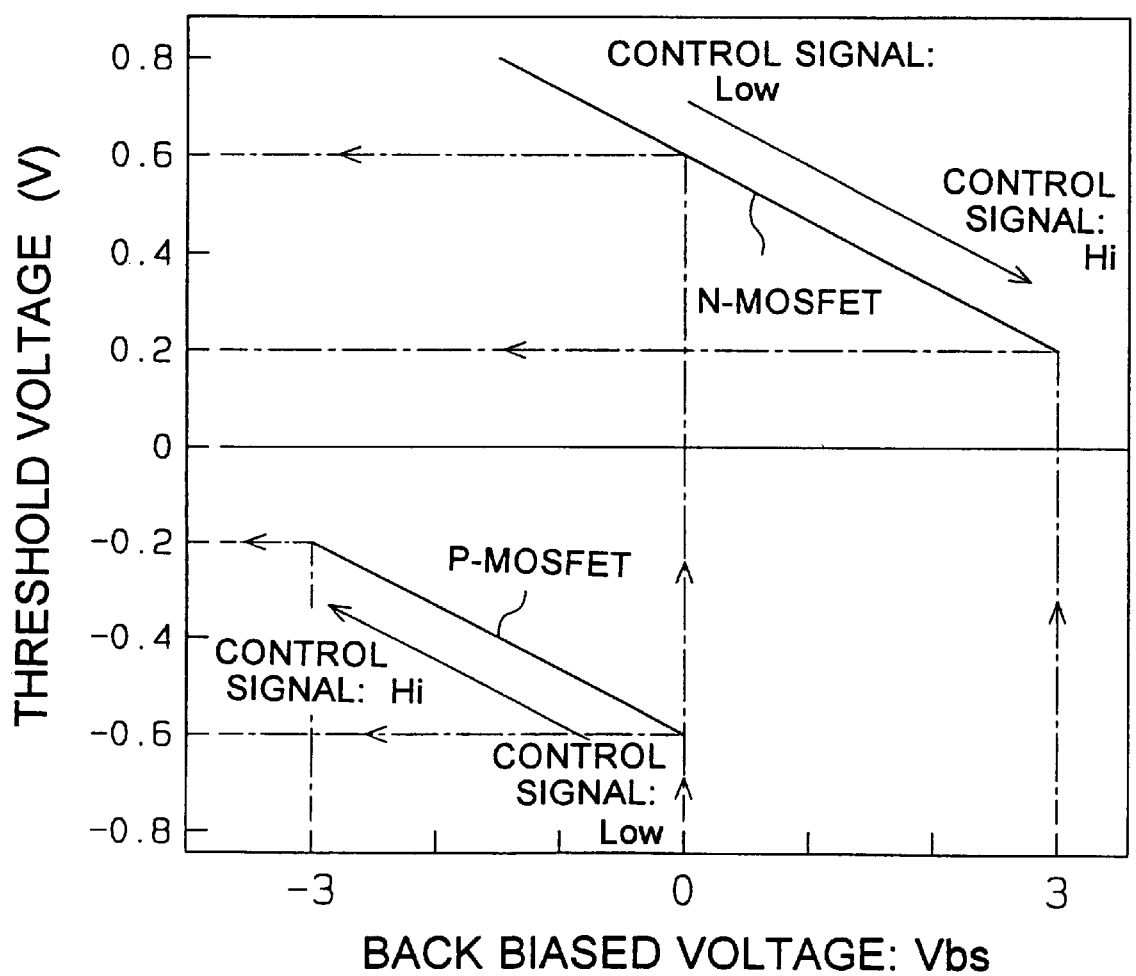
FIG. 6 is a characteristic diagram showing the relationship between a substrate bias voltage and a threshold voltage.

First, when the LSI 1 is in the waiting state, the Low-level signal is inputted into the control signal terminal P of the bias voltage switching circuit 2. The electric potential of the bias line 31 for the P-channel is switched to the source voltage $V_{DD}$ (3 volts) and the electric potential of the bias electrode 28 for the P-channel is also switched to the source voltage $V_{DD}$ (3 volts) on one hand, and the electric potential of the bias line 33 for the N-channel is switched to the ground potential (0 volt) and the electric potential of the bias electrode 29 for the N-channel is also switched to the ground potential (0 volt). The respective threshold voltages $V_t$ of the FETs of the LSI 1 are determined by the respective electric potentials of the bias electrodes 28 and 29 through the bias lines 31 and 33 respectively according to FIG. 6 as follows.

As the respective back biased voltages of the N-channel type MOSFETs 8, 10, 12 and 14 are 0 volt, the threshold voltages $V_t$ thereof are 0.6 volt. On the other hand, although the respective back biased voltages of the P-channel type MOSFETs 7, 9, 11 and 13 are 3 volts, from the viewpoint of source voltage (3 volts), this is equivalent to the respective applications of 0 volt, and therefore, the threshold voltages $V_t$ thereof are −0.6 volt. Accordingly, since the respective absolute values of threshold voltages $V_t$ of the MOSFETs are large, a circuit which has a small leakage current but can operate at a low speed can be configured.

On the other hand, when the LSI 1 is in operation, the Hi-level signal is inputted into the control signal terminal P of the bias voltage switching circuit 2. The electric potential of the bias line 31 for the P-channel is switched to the ground potential (0 volt) and the electric potential of the bias electrode 28 for the P-channel is also switched to the ground potential (0 volt) on one hand, and the electric potential of the bias line 33 for the N-channel is switched to the source voltage $V_{DD}$ (3 volts) and the electric potential of the bias electrode 29 for the N-channel is also switched to the source voltage $V_{DD}$ (3 volts). The respective threshold voltages $V_t$ of the FETs of the LSI 1 are determined by the respective electric potentials of the bias electrodes 28 and 29 through the bias lines 31 and 33 respectively according to FIG. 6 as follows.

As the respective back biased voltages of the N-channel type MOSFETs 8, 10, 12 and 14 are 3 volts, the threshold voltages $V_t$ thereof are 0.2 volt. On the other hand, although the respective back biased voltages of the P-channel type MOSFETs 7, 9, 11 and 13 are 0 volt, from the viewpoint of source voltage (3 volts), this is equivalent to the respective applications of −3 volts, and the threshold voltages $V_t$ thereof are −0.2 volt. Accordingly, since the respective absolute values of threshold voltages $V_t$ of the MOSFETs are small, a circuit which can operate at a fast speed but which has a large leakage current can be configured.

As described above, according to this embodiment, the semiconductor device is constructed so that the plurality of SOI layers 18–25 (monocrystalline semiconductor layers) are formed on the monocrystalline silicon substrate 15 (semiconductor substrate) through the silicon oxide film 17 (insulator layer). The C-MOS circuits 3–6 are configured with the P-channel type MOSFETs 7, 9, 11 and 13 and the N-channel type MOSFETs 8, 10, 12 and 14 on the SOI layers 18–25. This semiconductor device so constructed as described above comprises the bias electrode 28 for P-channel (first electrode) disposed within the silicon oxide film 17 facing the respective channel regions of at least the P-channel type MOSFETs 7, 9, 11 and 13. The bias electrode 29 for N-channel (second electrode) disposed within the silicon oxide film 17 faces the respective channel regions of at least the N-channel type MOSFETs 8, 10, 12 and 14. The bias voltage switching circuit 2 (bias voltage switching means) for applies electric potential to the bias electrode 28 for the P-channel and bias electrode 29 for the N-channel to increase the respective absolute values of threshold voltages $V_t$ of the MOSFETs 7–14 when the LSI 1 is in the waiting state and applies electric potential to the bias electrode 28 for P-channel and bias electrode 29 for N-channel to reduce the respective absolute values of threshold voltages $V_t$ of the MOSFETs 7 through 14 when the LSI 1 is in the operating state. Accordingly, when the LSI 1 is in the waiting state, each absolute value of the threshold voltage $V_t$ is large, the LSI 1 is in operation at a low speed, but the leakage current can be controlled to be small. When the LSI 1 is in the operating state, each absolute value of the threshold voltage $V_t$ is small, the leakage current is large, but the LSI 1 can operate at a high speed.

The bias voltage switching circuit 2 (bias voltage switching means) is configured with the inverter circuits 34 and 35. Therefore, with such a simple configuration, it is possible to freely vary the respective threshold voltages $V_t$ of the same conductive type transistors by selectively outputting two different electric potentials according to the control signal.

While the present invention has been shown and described with reference to the foregoing preferred embodiment, it will be apparent to those skilled in the art that changes in form and detail may be made therein without departing from the scope of the invention as defined in the appended claims. For example, although the bias electrodes 28 and 29 are disposed under all the regions of the MOSFETs 7–14 in the above embodiment, these bias electrodes 28 and 29 may be disposed at least within the silicon oxide film 17 facing the respective channel regions of the MOSFETs 7–14.

Furthermore, although the LSI 1 is configured with the inverter circuits 3–6 in the above embodiment, the LSI 1 may also be configured with large scale circuits such as CPU, DSP, gate array, ROM and RAM.

As described above in detail, according to the present invention, an excellent effect that the transistor can be operated at a high speed with a small leakage current whenever it is necessary to operate the transistor in such way.

What is claimed is:

1. A semiconductor device comprising:
   a monocrystalline semiconductor layer formed on an insulative substrate;
   a MOSFET formed on the monocrystalline semiconductor layer and including a source region, a drain region and a gate electrode for controlling current flowing between said source and drain regions by an applied gate voltage;
   a buried electrode disposed within a region facing said gate electrode within said insulative substrate; and
   an electric potential switching means connected to said buried electrode for setting an electric potential of said buried electrode to a first electric potential to increase an absolute value of a threshold voltage of said MOSFET when said MOSFET is in a waiting state and setting said electric potential of said buried electrode to a second electric potential to reduce said absolute value of said threshold voltage of said MOSFET when said MOSFET is in an operating state;

wherein said electric potential of said buried electrode is switched between a power source voltage and a ground potential of said MOSFET; and said MOSFET is a N-channel type MOSFET.

2. A semiconductor device according to claim 1, wherein said first electric potential is said ground potential of said MOSFET and said second electric potential is said power source voltage.

3. A semiconductor device according to claim 2, wherein said source region of said MOSFET is grounded.

4. A semiconductor device comprising:

a substrate;

an insulating layer disposed on said substrate;

first and second monocrystalline semiconductor layers formed on said substrate with said insulating layer interposed therebetween;

a complementary MOS circuit composed by forming a P-channel type MOSFET and a N-channel type MOSFET on said first and second monocrystalline semiconductor layers, respectively;

a first buried electrode disposed within said insulating layer facing a channel region of said P-channel type MOSFET;

a second buried electrode disposed within said insulating layer facing a channel region of said N-channel type MOSFET; and an electric potential switching means connected to said first buried electrode and said second buried electrode for applying electric potentials to said first and second buried electrodes to increase an absolute value of a threshold voltage of each of said P-channel type MOSFET and said N-channel type MOSFET when each of said P-channel type MOSFET and said N-channel type MOSFET is in a waiting state and applying electric potentials to said first and second buried electrodes to reduce said absolute value of said threshold voltage of each of said P-channel type MOSFET and said N-channel type MOSFET when each of said P-channel type MOSFET and said N-channel type MOSFET is in an operating state, wherein said electric potentials applied to said first and second buried electrodes are switched between a power source voltage and a ground potential of each of said P-channel type MOSFET and said N-channel type MOSFET.

5. A semiconductor device according to claim 4, wherein said electric potential switching means applies said ground potential to said second buried electrode when said power source voltage is applied to said first buried electrode and applies said power source voltage to said second buried electrode when said ground potential is applied to said first buried electrode.

6. A semiconductor device according to claim 5, wherein said electric potential switching means comprises an inverter circuit connected between said first buried electrode and said second buried electrode.

7. A semiconductor device according to claim 4, wherein a plurality of first monocrystalline semiconductor layers and a plurality of second monocrystalline layers are formed on said substrate with said insulating layer interposed therebetween, a plurality of P-channel type MOSFETs and a plurality of N-channel type MOSFETs are formed on said plurality of first monocrystalline semiconductor layers and said plurality of second monocrystalline semiconductor layers, respectively, and said first buried electrode is formed from a single layer facing said plurality of P-channel type MOSFETs and said second buried electrode is formed from a single layer facing said plurality of N-channel type MOSFETs.

8. A semiconductor device comprising:

a plurality of monocrystalline semiconductor layers formed on an insulative substrate, said plurality of monocrystalline semiconductor layers being isolated and insulated from each other;

a Plurality of MOSFETs formed on the monocrystalline semiconductor layers, each of said MOSFETs including a source region, a drain region and a gate electrode for controlling current flowing between said source and drain regions by an applied gate voltage;

a buried electrode formed from a single layer and disposed within said insulative substrate to face said gate electrode of each of said MOSFETs; and an electric potential switching means connected to said buried electrode for setting an electric potential of said buried electrode to a first electric potential to increase an absolute value of a threshold voltage of each of said MOSFETs when each of said MOSFETs is in a waiting state and setting said electric potential of said buried electrode to a second electric potential to reduce said absolute value of said threshold voltage of each of said MOSFETs when each of said MOSFETs is in an operating state;

wherein said electric potential of said buried electrode is switched between a power source voltage and a ground potential of each of said MOSFET; and each of said MOSFETs is a N-channel type MOSFET, said first electric potential is said ground potential and said second electric potential is said power source voltage.

* * * * *